(12) United States Patent
Dewhirst et al.

(10) Patent No.: US 9,797,936 B2
(45) Date of Patent: Oct. 24, 2017

(54) COUNTER ENHANCEMENTS FOR IMPROVED PERFORMANCE AND EASE-OF-USE

(71) Applicant: NATIONAL INSTRUMENTS CORPORATION, Austin, TX (US)

(72) Inventors: Adam H. Dewhirst, Colleyville, TX (US); Chee Fai Yap, Penang (MY)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 252 days.

(21) Appl. No.: 14/639,432

(22) Filed: Mar. 5, 2015

(65) Prior Publication Data

US 2016/0258990 A1    Sep. 8, 2016

(51) Int. Cl.
| | |
|---|---|
| *G01R 13/02* | (2006.01) |
| *G01R 23/02* | (2006.01) |
| *G01P 3/486* | (2006.01) |
| *H03K 21/02* | (2006.01) |
| *H03K 21/40* | (2006.01) |

(52) U.S. Cl.
CPC .............. *G01R 23/02* (2013.01); *G01P 3/486* (2013.01); *H03K 21/023* (2013.01); *H03K 21/40* (2013.01)

(58) Field of Classification Search
CPC ........ G01N 29/75; G01N 33/24; H03K 21/38; H03K 21/40
See application file for complete search history.

(56) References Cited

U.S. PATENT DOCUMENTS

| | | | | |
|---|---|---|---|---|
| 4,891,825 A | * | 1/1990 | Hansen | H03K 21/08 327/115 |
| 5,003,560 A | * | 3/1991 | Kim | H04L 7/08 327/231 |
| 5,233,638 A | | 8/1993 | Moriwaki | |

(Continued)

OTHER PUBLICATIONS

Minitaur DEWE-101 Dynamic Data Logging System; 2009 (DEWE-101_brochure.pdf); Dewetron, Inc. (12 pages).

(Continued)

*Primary Examiner* — Tung X Nguyen
*Assistant Examiner* — Dominic Hawkins
(74) *Attorney, Agent, or Firm* — Meyertons Hood Kivlin Kowert & Goetzel, P.C.; Jeffrey C. Hood

(57) ABSTRACT

An improved counter may implement dynamic frequency measurement while also remaining fully backwards compatible with traditional frequency measurement methods. The counter may operate according to low-frequency, large range, and/or high frequency modes of operation. It may be programmable with a divisor value associated with the large range operating mode, and a measurement time associated with the high frequency mode of operation. The divisor and measurement time settings may be enabled or disabled, and when either setting is disabled, the counter becomes backwards compatible with traditional frequency measurement methods. The counter may also be provided with inputs representative of the desired type of measurement and the minimum and maximum expected values for the signal to be measured. The counter may perform the frequency measurement according to any one or more of the operating modes, and return a measurement result obtained in the operating mode that completes the measurement first.

20 Claims, 14 Drawing Sheets

(56) References Cited

U.S. PATENT DOCUMENTS

| | | | |
|---|---|---|---|
| 5,499,273 A * | 3/1996 | Kull | H04L 27/2273 375/326 |
| 5,877,715 A | 3/1999 | Gowda | |
| 6,018,258 A * | 1/2000 | Kang | G06F 7/68 327/115 |
| 6,445,760 B1 * | 9/2002 | Weintraub | H03K 23/588 377/118 |
| 6,957,328 B2 | 10/2005 | Goodman | |
| 8,045,662 B2 | 10/2011 | Zhuang | |
| 8,294,504 B2 | 10/2012 | Pontius | |
| 8,837,658 B2 | 9/2014 | Chiang | |
| 2004/0138877 A1 * | 7/2004 | Ariu | G10L 19/22 704/211 |
| 2005/0146360 A1 * | 7/2005 | Reichert | G06F 1/0328 327/105 |
| 2005/0271175 A1 * | 12/2005 | Lashkarian | H04L 27/2657 375/355 |
| 2006/0250171 A1 * | 11/2006 | Lee | H03L 7/0812 327/158 |
| 2010/0176835 A1 * | 7/2010 | Sasajima | G01R 31/31922 324/750.3 |
| 2011/0131013 A1 * | 6/2011 | Lee | G01D 21/00 702/188 |
| 2012/0017130 A1 * | 1/2012 | Kulkarni | G01R 31/318558 714/731 |
| 2012/0098603 A1 * | 4/2012 | Cho | H03L 7/099 331/34 |
| 2013/0070879 A1 * | 3/2013 | Horley | G04F 10/04 375/354 |

OTHER PUBLICATIONS

Velocity Filter Settings in NI-Motion; Feb. 17, 2015; National Instruments Corporation (3 pages).

* cited by examiner

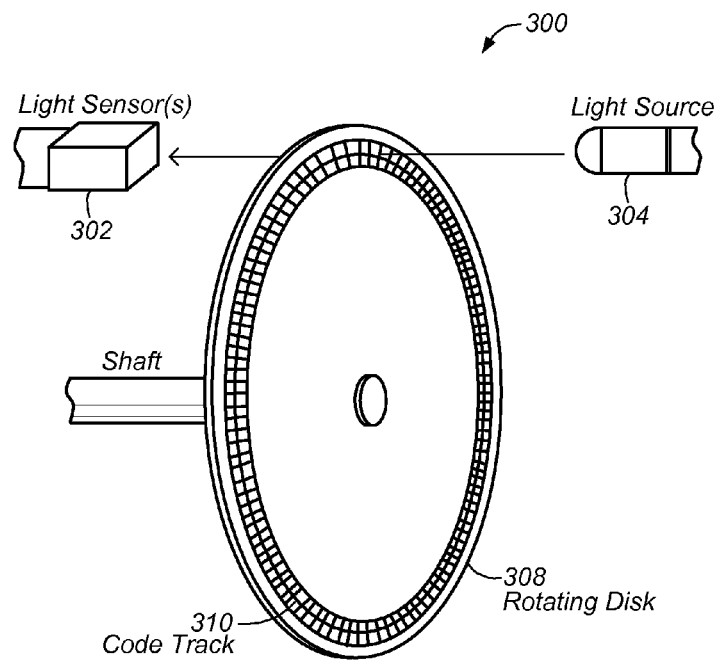
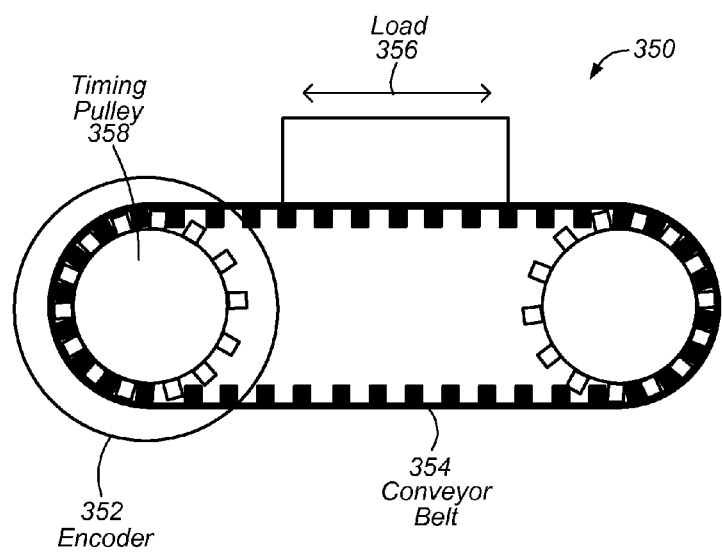
FIG. 3
(Prior Art)

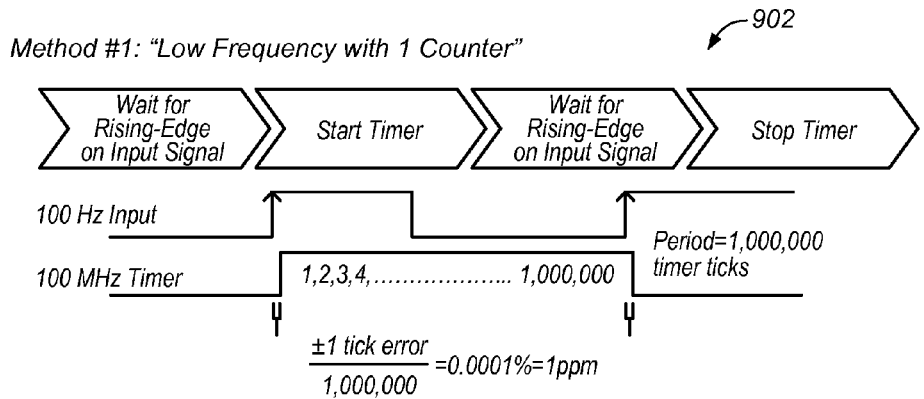
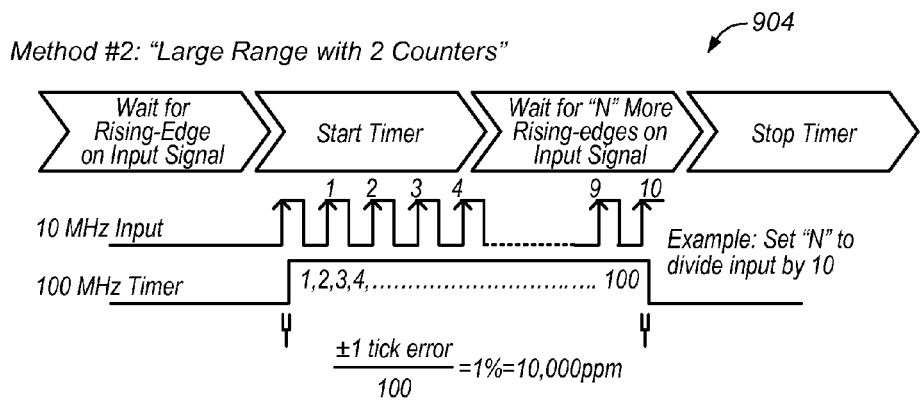
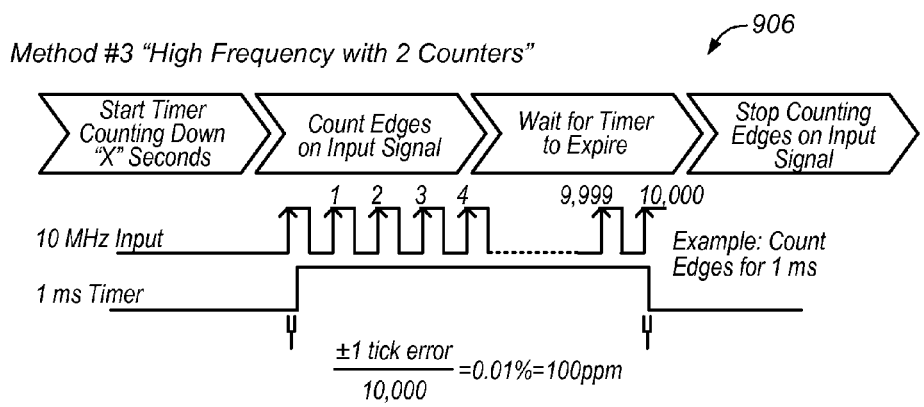
FIG. 9
(Prior Art)

| | Input Frequency | Measurement Time | | Measurement Error | |
|---|---|---|---|---|---|
| Method 902 | 100 Hz | 1/100 Hz=10ms | ✗ | 0.0001 % | ✓ |
| | 10 MHz | 1/10 MHz=100 ns | ✓ | 10 % | ✗ |

| | Input Frequency | Measurement Time | | Measurement Error | |
|---|---|---|---|---|---|
| Method 904 | 100 Hz | 1/100 Hz=0.1 s | ✗ | 0.0001 % | ✓ |
| | 10 MHz | 10/10 MHz=1 μs | ✓ | 1 % | ⊖ |

| | Input Frequency | Measurement Time | | Measurement Error | |
|---|---|---|---|---|---|
| Method 906 | 100 Hz | 1 ms | ✓ | 100 % | ✗ |
| | 10 MHz | 1 ms | ✓ | 1 % | ⊖ |

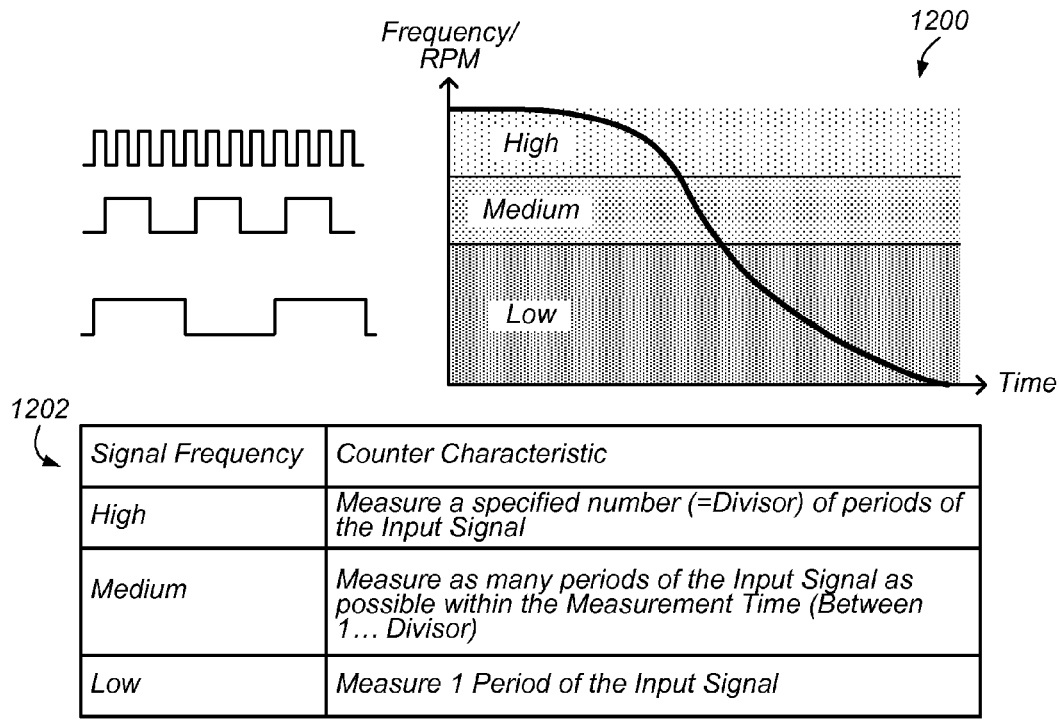

| Signal Frequency | Counter Characteristic |
|---|---|
| High | Measure a specified number (=Divisor) of periods of the Input Signal |
| Medium | Measure as many periods of the Input Signal as possible within the Measurement Time (Between 1 ... Divisor) |
| Low | Measure 1 Period of the Input Signal |

FIG. 12

| Measurement Time | Divisor | Traditional Mode Equivalent | Notes |
|---|---|---|---|
| 0 (Disable) | 1 | Low Frequency with 1 Counter | One period of the user's input is measured and the measurement is returned. |
| <Meas. Time> | 0 (Disable) | High Frequency with 2 Counters | Count the number of periods of the user's input signal that occur during <Meas. Time>, and then return that measurement. |
| 0 (Disable) | <Divisor> | Large Range with 2 Counters | Count how long it takes for <Divisor> periods of the user's signal to elapse, and then return that measurement. |
| <Meas. Time> | <Divisor> | "Dynamic Frequency Measurement" (New Mode) | Perform the measurement 2 in different ways, and return whichever one completes first. |

FIG. 13

COUNTER ENHANCEMENTS FOR IMPROVED PERFORMANCE AND EASE-OF-USE

FIELD OF THE INVENTION

The present invention relates to the field of instrumentation, and more particularly to the design of an improved counter circuit and system.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

Instrumentation systems oftentimes make use of counters. Counters are typically used for many different types of measurements with and within DAQ Systems. For example, by counting the number of events on an input signal, or measuring the time between those events, counters are able to perform measurements such as: event counting, period measurements, frequency measurements, position measurements, and velocity measurements, among others. These counter measurements are commonly used to measure the behavior of physical systems. For example, an encoder may be attached to a rotating shaft to measure the position as well as velocity (RPM, or revolutions per minute) of the shaft. In a DAQ system, counter measurements are often correlated with other measurements in the system such as analog input (voltage, temperature, strain, etc.) as well as other counter measurements. In such a system, a "sample clock" is commonly used to indicate the point in time at which the measurements are to be performed.

When the sample clock is used to sample measurements from a counter, there are certain expectations regarding the accuracy of the measurement as relating to the behavior of the physical system for which measurements are taken. For example, in case of the rotating shaft, the returned value of the measurement is ideally expected to be representative of an instantaneous reading of the current position and/or velocity of the shaft being tracked by the encoder. Unfortunately, the encoder does not provide an instantaneous reading, only a series of pulses whose timing is unrelated to the sample clock. Since an instantaneous reading is unavailable, the counter returns the most recently completed counter measurement. The delay associated with the most recently completed (also referred to herein as "old") measurement can cause problems. Because the encoder pulses are quantized—for example, one pulse might represent ten degrees of rotation—the encoder may not be able to detect angle changes (changes in angle) that are smaller than ten degrees.

A somewhat unrelated counter problem exists regarding the way that frequency (or velocity) measurements are performed. Typical counters may be used in three different ways to provide frequency measurements. Each different method implements a different tradeoff in attempting to balance measurement accuracy versus measurement delay. Unfortunately, this creates an additional problem. Counter frequency measurements may become overly confusing when contending with and having to understand three different modes of operation. Furthermore, choosing between the three different modes of operation (or three different operating modes) requires a fixed accuracy versus delay tradeoff. For applications that operate over a wide range of frequencies, there may not be an acceptable tradeoff available.

Other corresponding issues related to the prior art will become apparent to one skilled in the art after comparing such prior art with the present invention as described herein.

SUMMARY OF THE INVENTION

Various embodiments of an improved counter may have the capability of performing dynamic frequency measurements while also remaining fully backwards compatible with traditional frequency measurement methods. The improved counter may operate according to multiple types or methods of operation, including low-frequency, large range, and/or high frequency modes of operation. In addition, the improved counter may be programmable with a divisor value associated with the large range operating mode, and a measurement time associated with the high frequency operating mode. The divisor and measurement time settings may be enabled or disabled, and when either setting is disabled, the counter becomes backwards compatible with traditional frequency measurement methods. The counter may also be provided with inputs representative of the desired type of measurement and the minimum and maximum expected values for the signal to be measured. The counter may perform the frequency measurement according to any one or more of the available operating modes (or methods of operation), and may return a measurement result (or count value or measurement value) obtained in the operating mode that completes the measurement first.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which:

FIG. 3 shows examples of devices which use encoders that provide feedback signals representative of operational characteristics of the devices;

FIG. 9 shows descriptions and corresponding timing diagrams of typical frequency measurement methods, according to prior art;

FIG. 12 shows a graph and table illustrating counter characteristics for different methods of operation of an improved counter, according to one embodiment;

FIG. 13 shows a table illustrating the programmability of an improved counter capable of performing dynamic frequency measurements, according to one embodiment;

Figure 1:
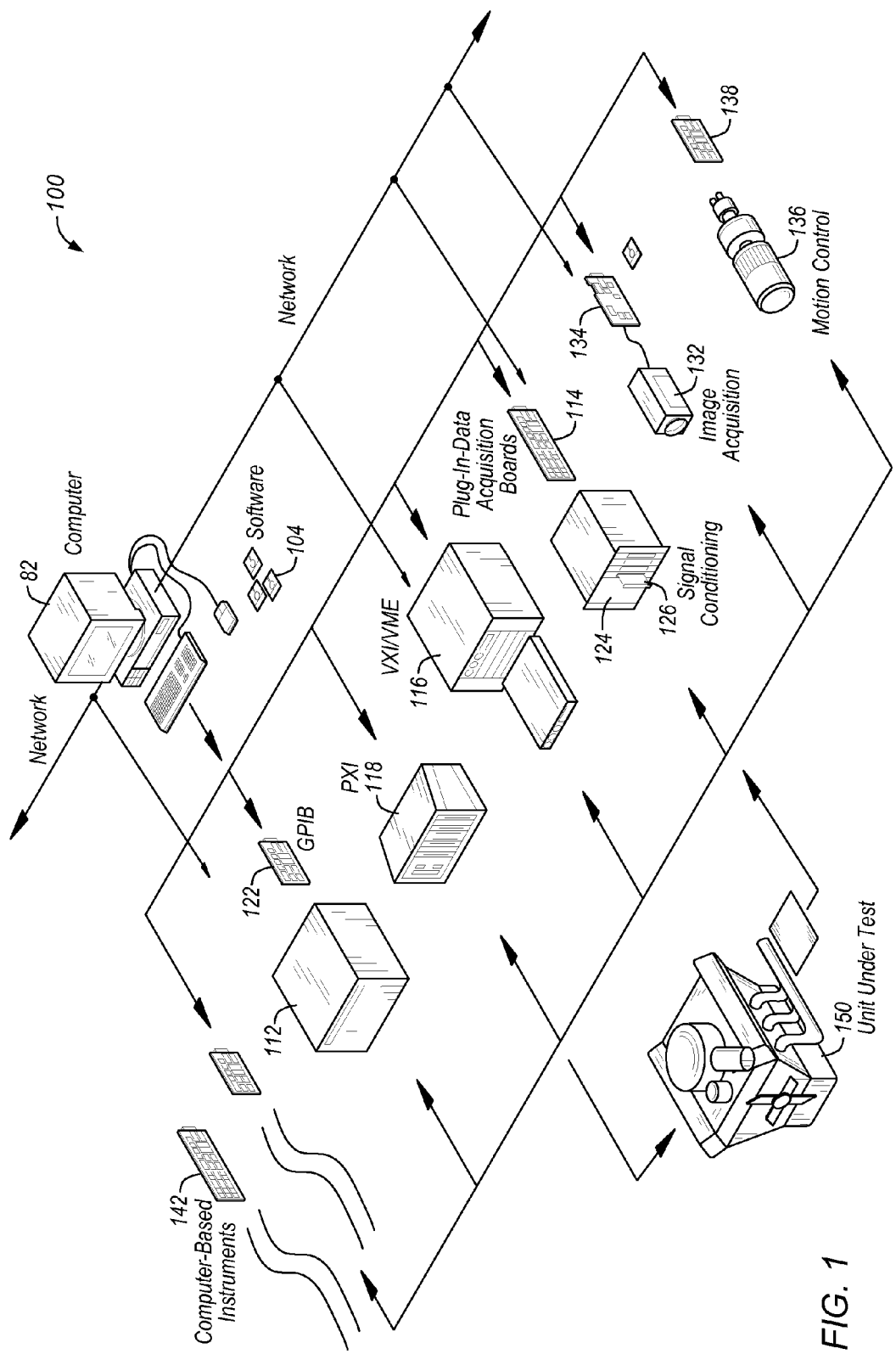
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of improved counters described herein may be used in systems configured to perform test and/or measurement functions, to control and/or model instrumentation or industrial automation hardware, or to model and simulate functions, e.g., modeling or simulating a device or product being developed or tested, etc. More specifically, they may be used in various instances where a counter and/or frequency measurements for instrumentation/measurement equipment are required, without degrading the performance and accuracy of the measurements, and providing flexibility of use. However, it is noted that various embodiments may equally be used for a variety of applications, and such applications are not intended to be limited to those enumerated above. In other words, applications discussed in the present description are exemplary only, and various embodiments of improved counters including counters performing dynamic frequency measurement may be used in any of various types of systems.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
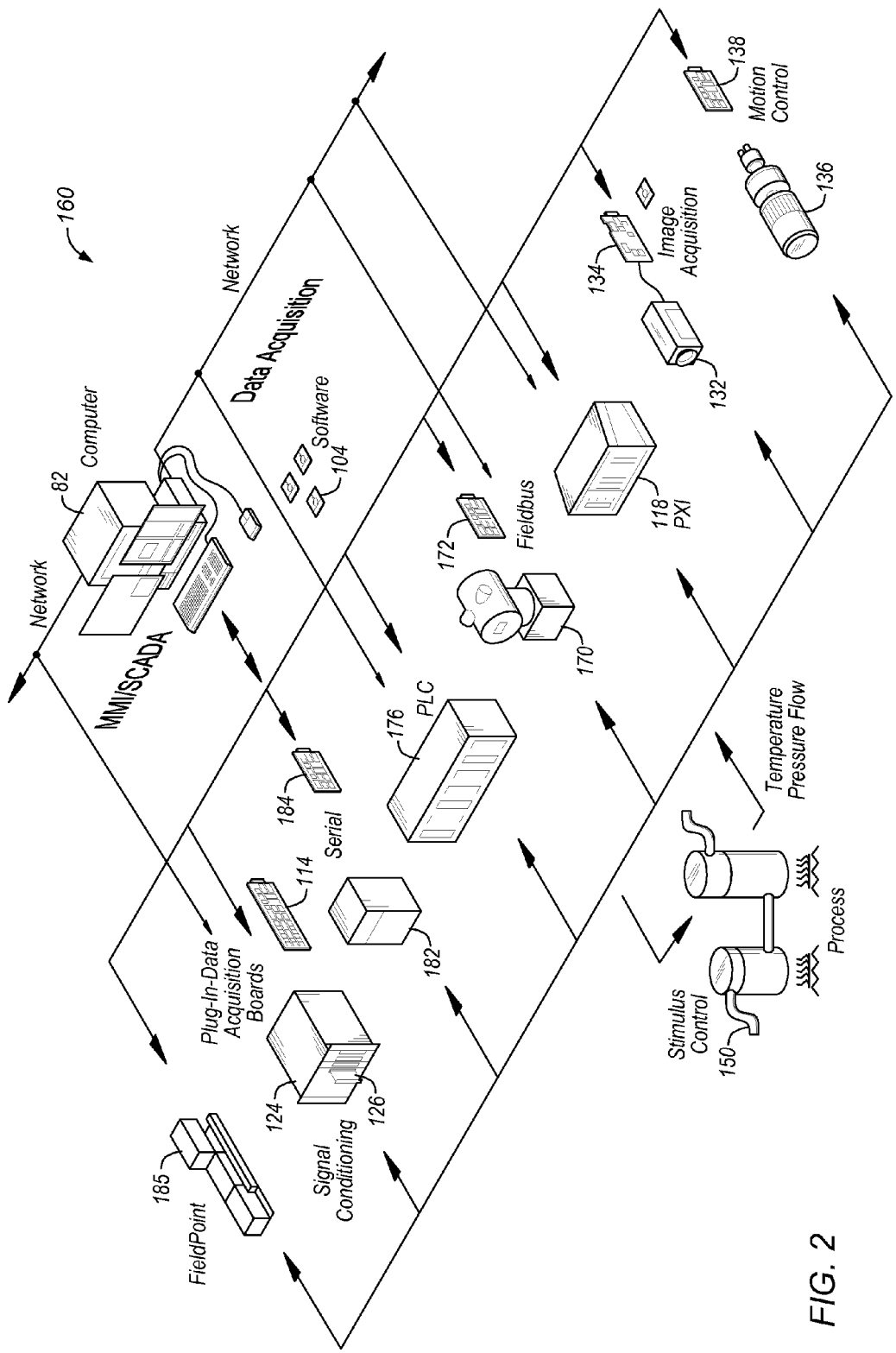
FIG. 2 shows an industrial automation system with instruments networked together according to one embodiment of the invention.

FIG. 2 illustrates an exemplary industrial automation system 160 that may be configured according to embodiments of the present invention. Industrial automation system 160 may be similar to instrumentation or test and measurement system 100 shown in FIG. 2. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Use of Counters

One or more of the devices and instruments shown in FIGS. 1 and 2 may include counters for a variety of uses. A couple of examples of device and/or instrument components which make use of counters are illustrated in FIG. 3. A rotating disk system 300 includes a rotating disk 308 with code tracks 310, which enable light sensor(s) 302 to generate, with the aid of light source 304, input signal(s) representative of the position of rotating disk 308. For example, light sensor(s) 302 may generate a series of pulses according to the position of the code track 310 by capturing light from light source 304 passing through code track 310. A counter may then be used to generate a value (e.g. a numeric value) representative of the position of rotating disk 308 according to input signal(s) based on information originating from light sensor(s) 302. Similarly, a conveyor belt system 350 may include a conveyor belt 354 for transporting a load 356. A timing pulley 358 includes "teeth" or "notches" (depending on the perspective), which engage similar "teeth" and "notches" in conveyor belt 354 to move conveyor belt 354. An encoder 352 tracks the conveyor belt position, and provides feedback indicative of the position of conveyor belt 354. In the example shown in FIG. 3, one "tick", (or indication of change of position) may be representative of a specified distance traveled by conveyor belt 354, for example 1 cm of distance. In such a case, a standard counter may quantize the position into 1 cm increments, even though the actual position of conveyor belt 354 may be continuously changing.

Counter Improvements: Measurement Delay

Figure 4:
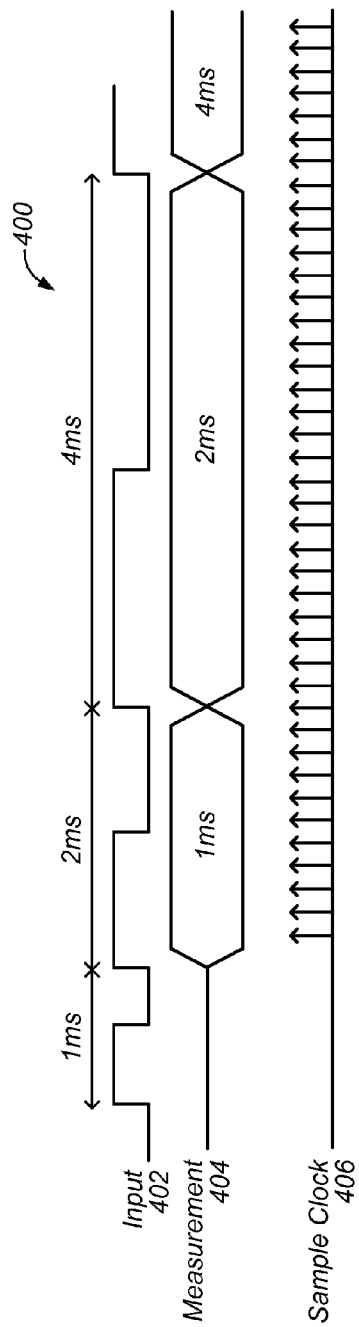
FIG. 4 shows a timing diagram illustrating period measurement of a decelerating input, according to prior art.

With reference to systems such as those exemplified in FIG. 3, FIG. 4 shows a timing diagram illustrating a period (or frequency or velocity or RPM) measurement of a decelerating input (for example rotating disk 308 decelerating, or conveyor belt 354 decelerating). As previously mentioned, a typical counter only produces new measurements when it receives new pulses on its input 402. In FIG. 4, the pulses are seen as the consecutive pulses that appear on input 402. FIG. 4 is illustrative of a decelerating input, hence the pulses are longer as time passes, and the respective period during which a pulse occurs also increasing in size as shown, from 1 ms to 2 ms to 4 ms (where "ms" stands for milliseconds). In the absence of new pulses on the input 402, the counter typically returns the most recent old measurement in response to sample clock 406 (e.g. in response to each rising edge of sample clock 406). This can result in significant errors, especially when measuring decelerating inputs as shown in FIG. 4. As mentioned above, with the input velocity decreasing, the input period 402 is getting longer, from 1 ms to 2 ms to 4 ms. Internally, the counter completes a measurement 404 only on edges of input signal 402. That is, the counter completes a measurement of the input signal 402 each time there is an edge (e.g. rising edge) of the input signal 402. The measurements are then stored each time a sample clock signal 406 (edge) occurs. Unfortunately, the returned measurement lags the actual velocity as shown.

Figure 5:
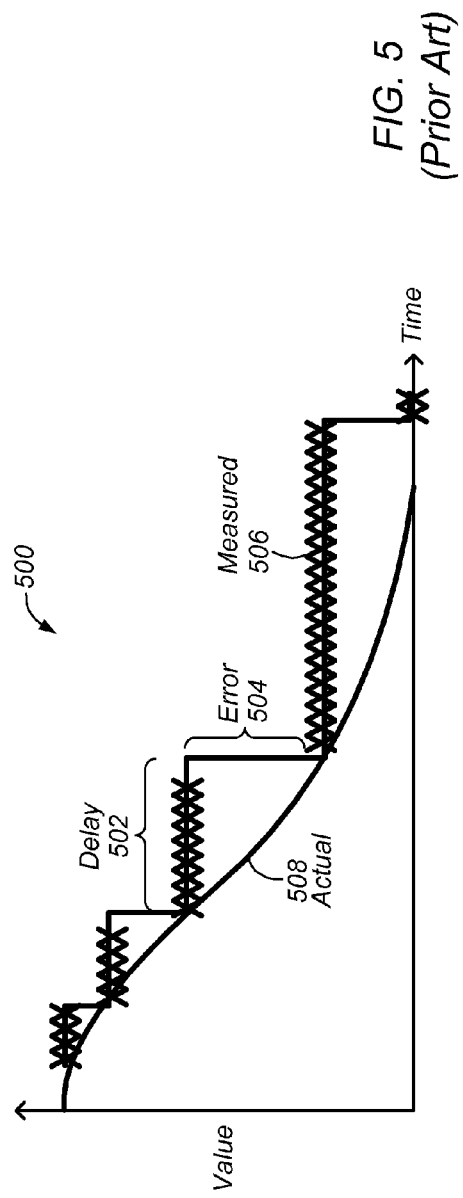
FIG. 5 shows a graph illustrating a typical counter measurement error related to the period measurement illustrated in FIG. 4, according to prior art.

FIG. 5 illustrates the typical counter measurement error by way of a graph 500 which shows the actual instantaneous value plotted versus the measured value. As clearly seen in FIG. 5, the actual value 508 differs considerably from the measured value 506 by an error value 504 due to delay 502. The counter measurement error illustrated in FIG. 5 may be substantially reduced, however, by reducing the delay associated with tracking the input. Specifically, as described above, when decelerating, i.e. when the velocity or speed is getting lower, each new input period is consequently slower (or longer) than the previous input period. In that case, the input may be continuously monitored. If the present input period, or input period for the present measurement becomes longer than the input period for the previous measurement, then the measurement may be continuously updated to reflect longer and longer periods, until the input toggles again, at which point a new period measurement has been completed.

Figure 6:
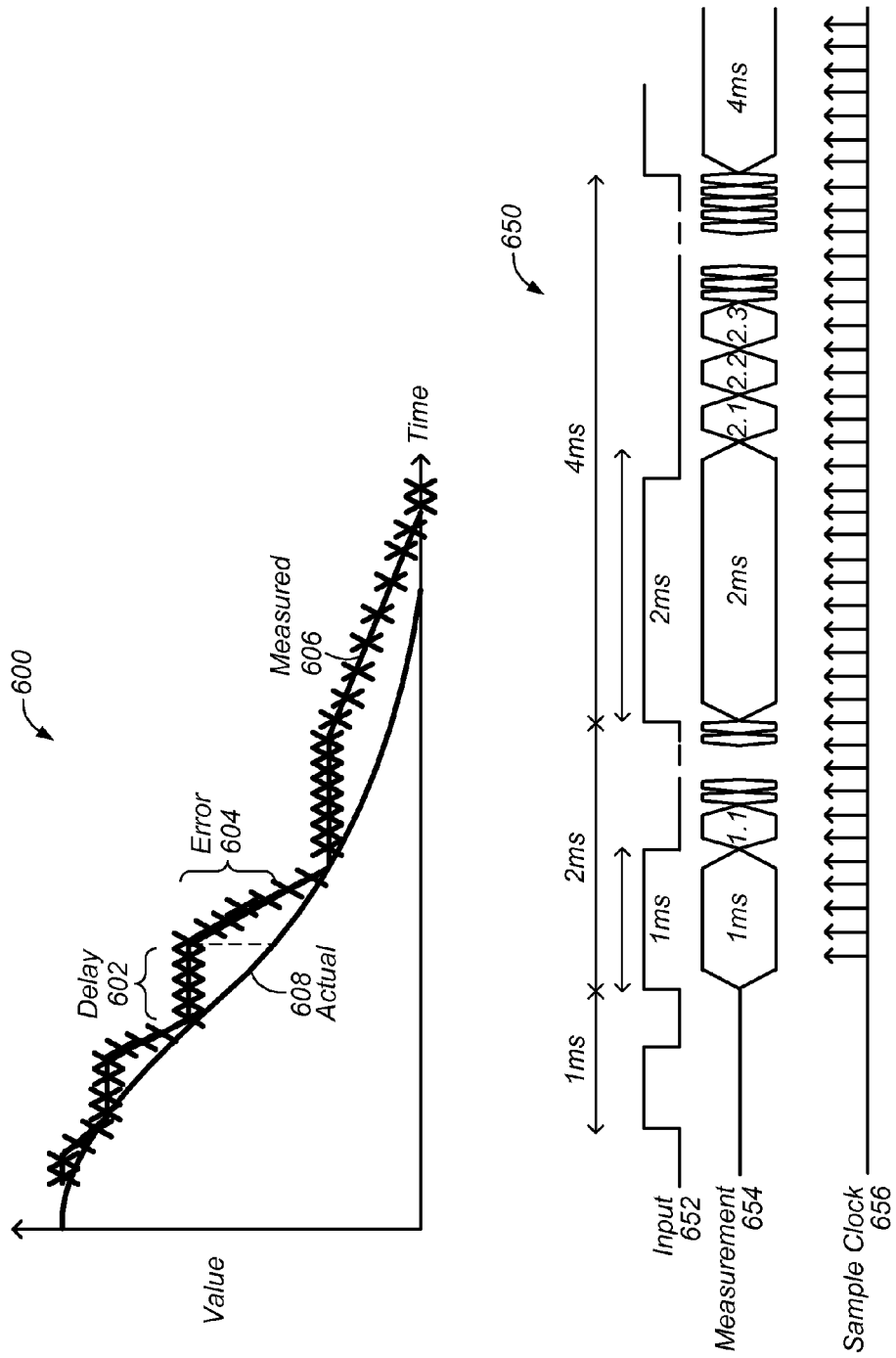
FIG. 6 shows a timing diagram illustrating period measurement of a decelerating input and a graph illustrating the corresponding counter measurement error according to one embodiment of an improved counter measurement method.

This process is illustrated in timing diagram 650 of FIG. 6. The input 652 is similar to input 402 shown in FIG. 4, and may be representative of input signals originating from a sensor or sensors tracking a decelerating target, for example the rotating disk 308 shown in FIG. 3). As shown in FIG. 6, the first input period is 1 ms. The second input period is 2 ms, and when it is ascertained that this present (second)

input period is longer than the previous input period, i.e. longer than 1 ms in this example, once the present input period exceeds 1 ms, the measurement is continuously updated until the end of the input period, at which time a new period measurement has also been completed, and determined to be 2 ms. During the subsequent input period, once a period of time representative of the previous input period (i.e. 2 ms in this case) has elapsed, the input 652 may again be continuously monitored until the end of the present input period (i.e. 4 ms in this case). This process may be applied for each subsequent input period as described above.

Figure 16:
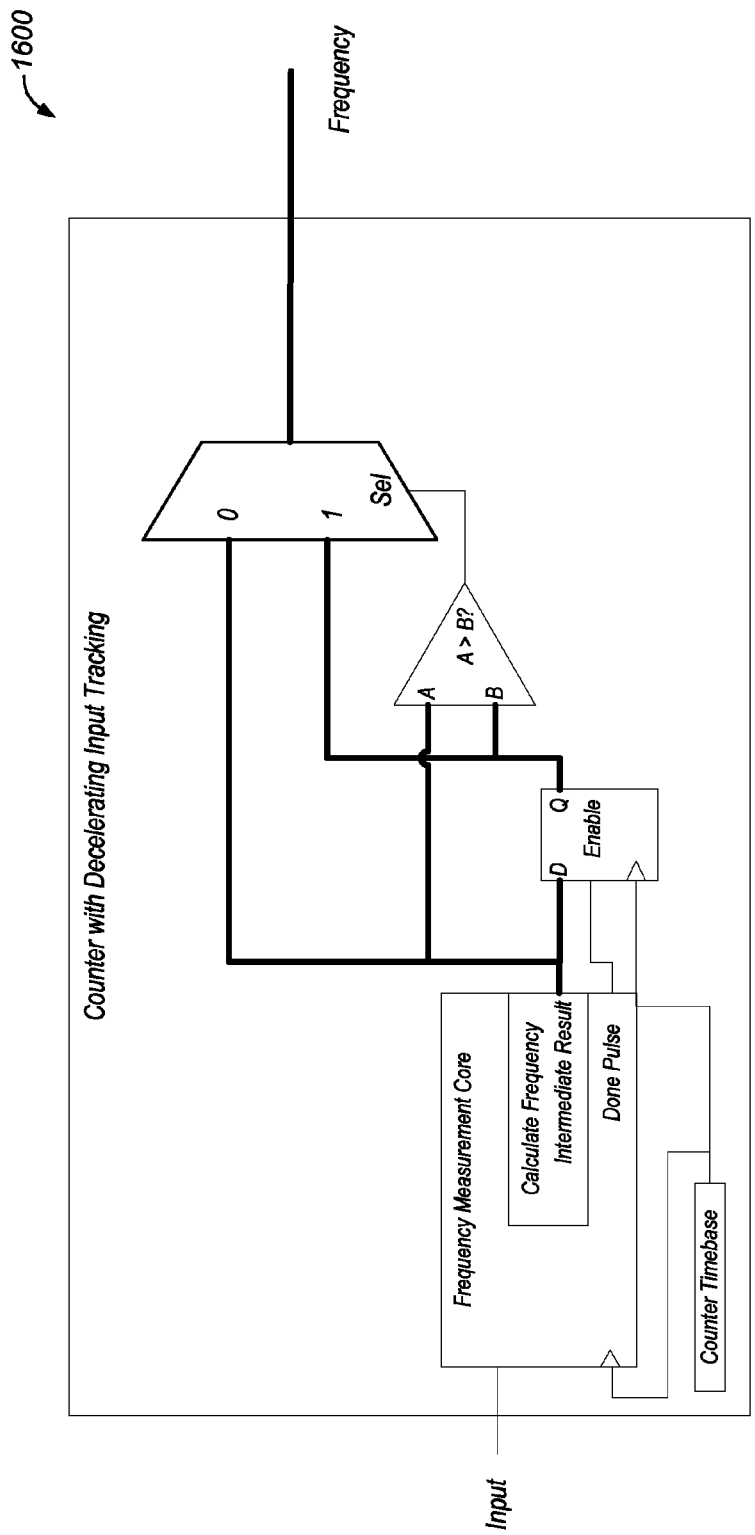
FIG. 16 shows a partial logic diagram of an improved counter capable of decelerating input tracking, according to one embodiment.

One example/embodiment of a counter capable of decelerating input tracking, and thus able to perform the process outlined in FIG. 6, is shown in FIG. 16. Counter 1600 is shown to perform measurements that return a Frequency value at the output. Specifically, FIG. 16 shows a simplified logic diagram of a frequency measurement counter 1600 that implements decelerating input tracking, highlighting the key concepts used in implementing the decelerating input tracking feature. It should be noted that the "Frequency Measurement Core" element in counter 1600 is not necessarily the same as the frequency measurement block shown in, for example, other counter embodiments disclosed herein. It should further be noted that the Intermediate Result output may be designed to operate as follows. The Intermediate Result may be initialized to the fastest possible frequency at the beginning of every measurement. It may then monotonically decrease during the measurement process, eventually reaching the actual input frequency value when Done Pulse is asserted. After the Done Pulse has been asserted, the Intermediate Result may be reset to the fastest possible frequency value, and the measurement process may begin again.

The benefit of this approach is illustrated in graph 600, where the value (both measured and actual) is plotted versus time. In contrast to graph 500, in graph 600 the measured value 606 is shown to more closely track the actual value 608, as the error 604 is reduced due to a shorter delay 602 between updated measurements.

Counter Improvements: Quantization Error

Figure 7:
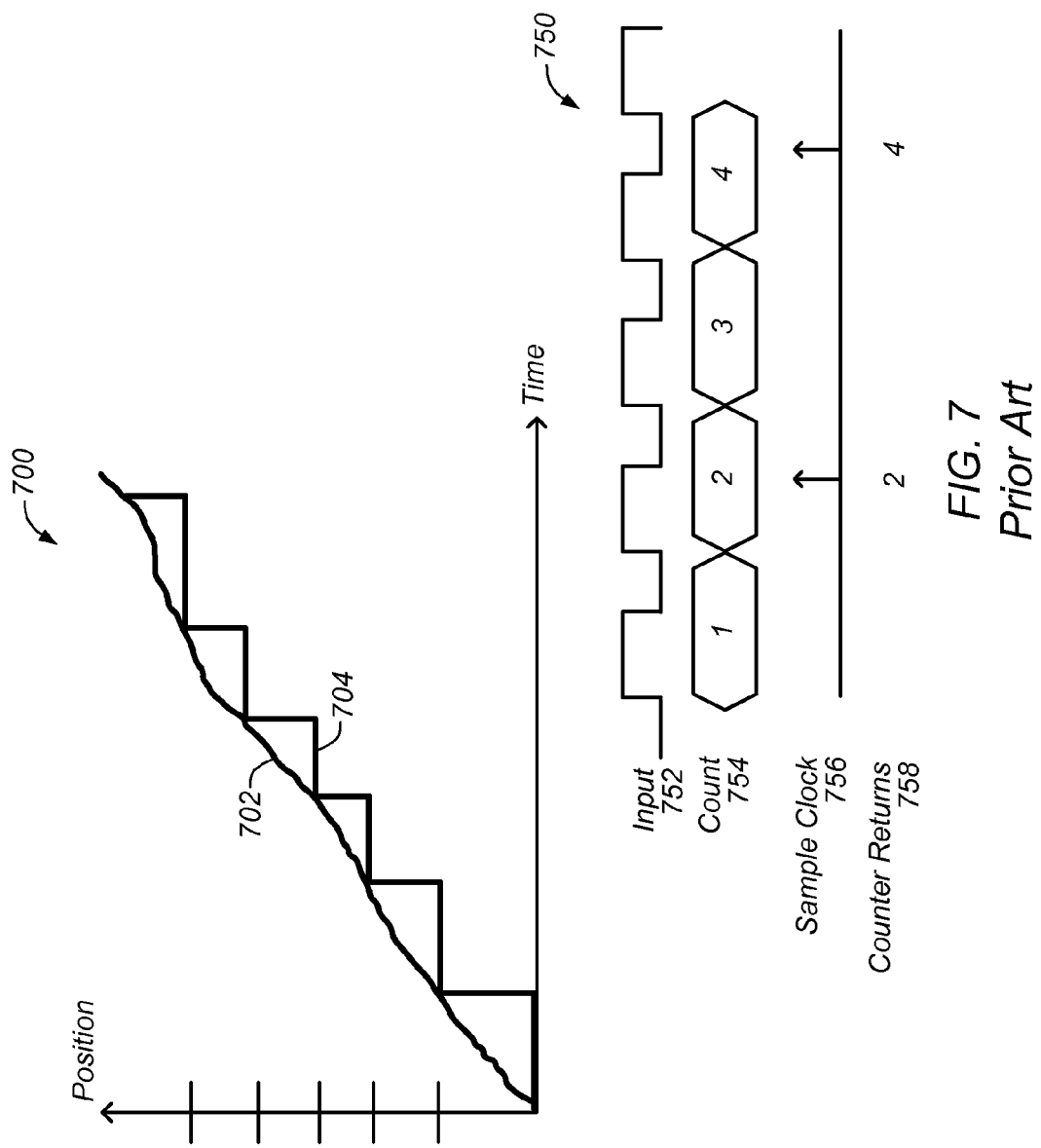
FIG. 7 shows a timing diagram illustrating period measurement representative of the position of a conveyor belt and a graph illustrating the corresponding counter quantization error according to prior art.

Referring again to FIG. 3, encoder 352 may be used to track the position of conveyor belt 354. As illustrated in FIG. 3, each "tick" or "stud" on timing pulley 358 represents a unit change of position of conveyor belt 354 as tracked by encoder 352. One (1) "tick" may represent a specified unit of distance, for example 1 cm of distance. The actual position of conveyor belt 354 may continuously change, however. Due to the implementation of encoder 352 as shown, a standard counter may thus quantize the position into 1 tick (or 1 specified unit of distance, or SUD for short) increments. This is illustrated in timing diagram 750 of FIG. 7, where a count 754 representative of input 752 is recorded for each edge of sample clock 756, resulting in counter return values 758. As shown in graph 700 representing position (of conveyor belt 354, for example) with respect to time, curve 702 representing the actual position differs from curve 704 representing the position as returned or indicated by the counter based on the input 752 provided by the encoder.

It is common for many systems to attempt to reduce this quantization error by performing software interpolation and/or low-pass filtering. In such cases the standard counter measurements, or counter measurement values (ex: the counter return values "2" and "4" shown in FIG. 7) are returned as an array of measurements. This array is then run through a software algorithm to interpolate and/or filter these values to more accurately estimate the actual position at any particular point in time. Unfortunately, for a standard counter, this interpolation process does not include an indication of when the counter has detected the particular position values. As a result, the interpolation process becomes less accurate, or is simply not as accurate as desired.

Figure 8:
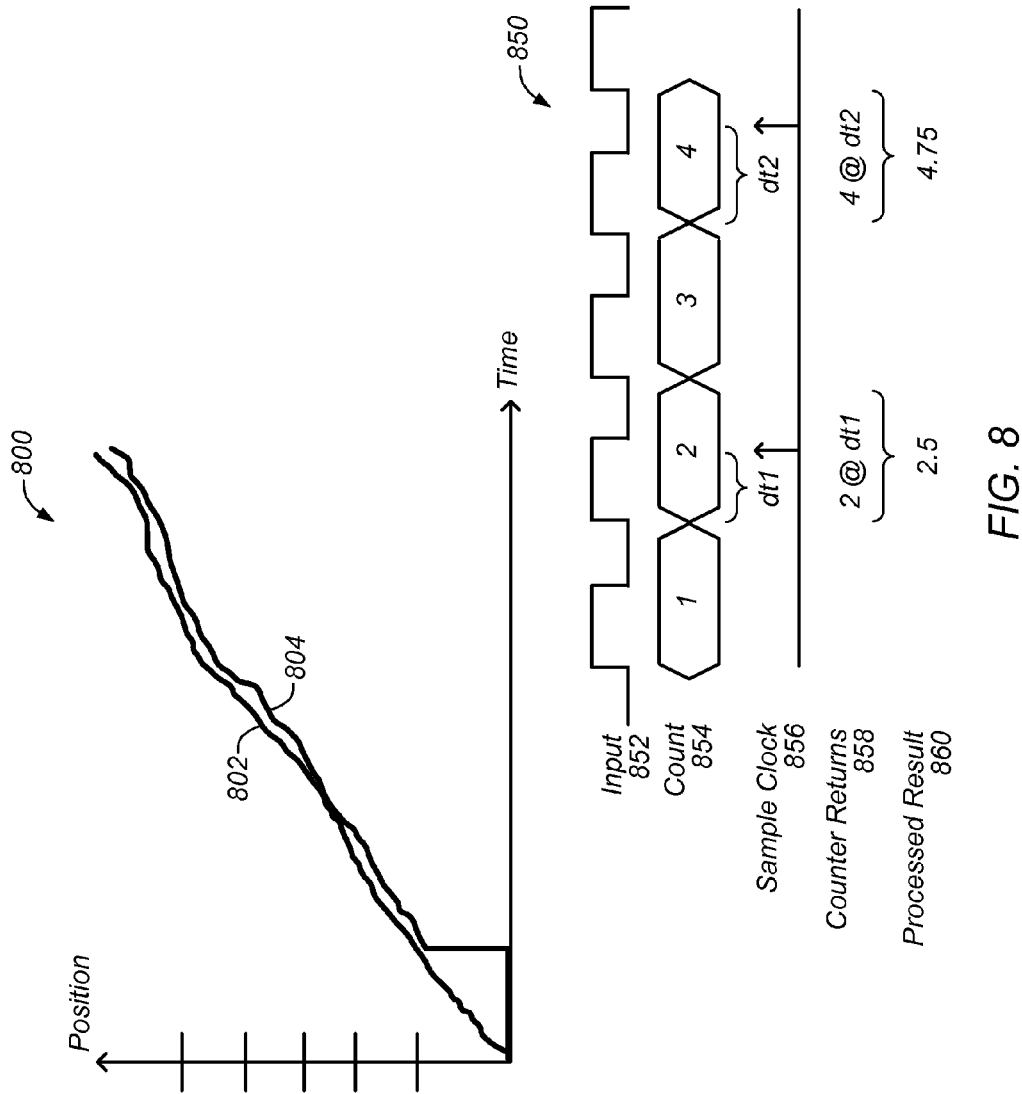
FIG. 8 shows a timing diagram illustrating period measurement representative of the position of a conveyor belt and a graph illustrating the corresponding counter quantization error according to one embodiment of an improved counter measurement method that includes timestamping and interpolation.

In one set of embodiments, a more accurate interpolation includes an enhancement to the counter, which provides timestamp information for each counter sample. This information may then be used to interpolate the position values. This is illustrated in FIG. 8, where timing diagram 850 shows input signal (input pulses) 852 being produced by the count encoder as usual, based on which a count 854 is generated. In addition, a timestamp "dt#", where "#" is the timestamp identifier is generated when each edge of count 854 occurs, and both the respective timestamp and corresponding count 854 value are stored (or returned, as indicated by counter returns 858) for each sample clock 856 edge. For example, as shown in FIG. 8, timestamp value dt1 and corresponding count value 2 are returned at the first indicated edge of sample clock 856, and timestamp value dt2 and corresponding count value 4 are returned at the second indicated edge of sample clock 856. Processed result 860 may then be obtained by interpolating the position value according to the timestamp and count value information. With such enhanced counters, software interpolation has access to both the raw count value plus a timestamp indicating when that count value occurred. To put it another way, the timestamp value may be indicative of a point in time to which the counter sample value corresponds.

Figure 17:
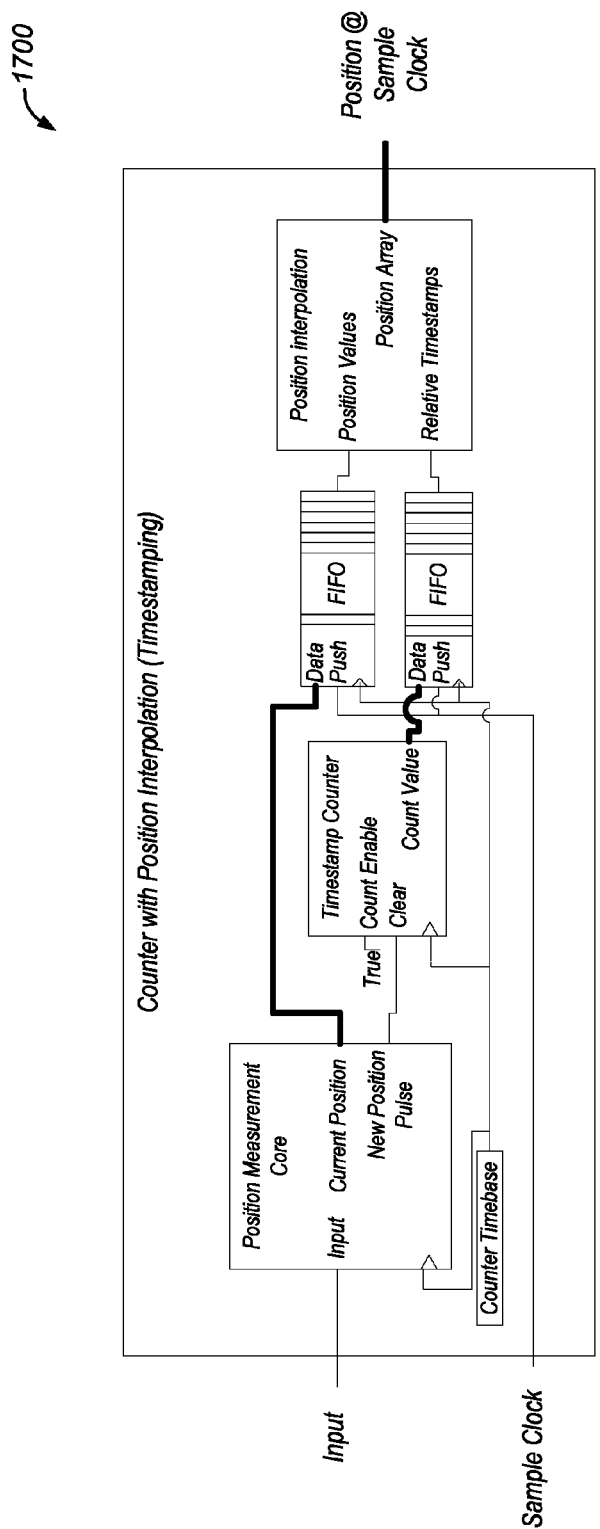
FIG. 17 shows a partial logic diagram of an improved counter capable of position interpolation, according to one embodiment.

FIG. 17 shows a simplified logic diagram of an improved counter 1700 that performs position interpolation, highlighting the key concepts used in implementing the position interpolation feature. The implementation shown in FIG. 17 is based on a known Sample Clock frequency. The measurements may be timestamped relative to the Sample Clock, which then allows for determining when each position change occurred, since both the Sample Clock rate and the relative timestamp with respect to the Sample Clock are known. In an alternative implementation, an absolute time epoch may be maintained within Counter 1700, and an absolute timestamp may be generated, i.e., the absolute time associated with each new position value may be timestamped. This would allow for interpolation to determine a position for any arbitrary point in time. With this information, more accurate interpolation may be performed between the raw counter codes to determine a more precise representation of the actual position corresponding to each sample clock edge, as illustrated in graph 800 where the measured position represented by curve 804 more closely tracks the actual position represented by curve 802, in contrast to the relationship illustrated in graph 700 between curves 704 and 702, respectively.

Counter Improvements: Dynamic Frequency Measurement

The general concept of using a counter to perform a time measurement on an unknown input may be summarized as follows. The measurement includes comparing the unknown input to a known timing reference. The unknown input and known timing reference may be provided to counter measurement logic, which measures the timing information for the unknown input by counting how many ticks (or periods) of the known timing reference correspond to a certain number of ticks (or periods) of the unknown input. This allows the measurement of timing information (such as period, frequency, velocity, etc.) for the unknown input within a certain degree (amount) of measurement error, where the measurement error depends on the specific method used.

FIG. 9 illustrates three common methods for using one or more counters to perform time-based measurements (such as period, frequency, velocity, etc.). It should be noted here that the generic expression "counter measurement" can also be used to describe other measurements such as a basic event count (ex: number of widgets detected), which differ from the time-based measurements discussed herein. A first method 902 uses one counter to measure a single period of an input signal. Method 902 produces accurate results for slower input frequencies, and is referred to as "Low Frequency with 1 Counter". As shown in FIG. 9, a 100 Hz input (the unknown input, in reference to the general concept of counter use in time-based measurements explained above) is measured using a 100 MHz timer (the known timing reference), resulting in one input period encompassing 1,000,000 timer ticks. It is worth noting here again that counter time measurements include the use of a known time reference (ex: 100 MHz timer) to determine the (time) duration of an unknown event, i.e. how long it takes for the unknown event (ex: 100 Hz Input) to occur. Accordingly, the 100 MHz timer indicated in FIG. 9 is merely an example of a time(r) reference, and the time reference may just as well be a 10 MHz timer, stopwatch, or any other time reference suitable to measure the unknown time. Referring again to method 902, during one sample period (of $\frac{1}{100}$ Hz), there are 1,000,000 edge occurrences of the timer. The measurement process includes waiting for the rising edge of the input signal and starting the timer (i.e. starting the count) responsive to the rising edge of the input signal. The timer is running until the next rising edge of the input signal, responsive to which the timer is then stopped. The uncertainty that may be present in starting and stopping the timer results in an error source of ±1 tick. Accordingly, the error may be expressed as 1 ppm (parts per million).

A second method 904 uses two counters. A first counter is used to divide down the input, and a second counter is used to measure the elapsed time. This method can produce accurate results over a wide range of input frequencies, so it is referred to as "Large Range with 2 Counters". As shown in FIG. 9, a 10 MHz input (again, the unknown input) is clocked using a 100 MHz timer (again, the known timing reference). However, in this case a second counter is used to count a specified number ("N") rising edges of the input signal before stopping the timer. Thus, the measurement process includes waiting for the rising edge of the input signal and starting the timer (i.e. starting the count of the first counter) responsive to the rising edge of the input signal. The timer then runs until the second counter counts Nth rising edges of the input signal, and responsive to counting N more rising edges of the input signal, the timer is then stopped. In the example shown for method 904 in FIG. 9, the value "N" is set to divide the input by 10. As in the previous method (902), the uncertainty that may be present in starting and stopping the timer results in an error source of ±1 tick. Accordingly, the error may be expressed as 10,000 ppm (parts per million).

A third method 906 uses two counters. One counter is used to measure a specific time interval, and a second counter is used to count the number of edges of the input signal that occur during this specific time interval. This method can produce accurate results for higher frequency input signals, and is referred to as "High Frequency with 2 Counters". As shown in FIG. 9, a 10 MHz input (again, the unknown input) is counted during an interval controlled by a 1 ms timer which functions as the known timing reference. In this case the measurement process includes starting the timer, counting down a specified number ("X") seconds. Once the timer has started, edges of the input signal are counted until the timer expires. Counting the edges on the input signal is therefore stopped upon expiration of the timer. In the example shown for method 906 in FIG. 9, the edges of the input signal are counted for 1 ms. As in the previous two methods (902 and 904), the uncertainty (that may be present in starting and stopping the counting) results in an error source of ±1 tick. Accordingly, the error may be expressed as 100 ppm (parts per million).

Unfortunately, having to understand three different count methods when creating applications may prove too confusing at times. Furthermore, in some cases it may not be possible to obtain a good accuracy versus frequency tradeoff. This is illustrated in the table 1000 shown in FIG. 10, which demonstrates the difficulty of balancing the measurement time versus delay. Table 1000 provides an indication of the desirability of various counter choices if the input signal ranges from 100 Hz to 10 MHz, and the measurement time (desired to be less than 1 ms) needs to be balanced with the error (desired to be less than 1%). As seen in table 1000, a perfect balance is not possible, but methods 904 and 906 at the high input frequency of 10 MHz yield results with measurement errors right at 1%.

In one set of embodiments, the capabilities of the counter may be extended for improved results. Settings may be provided (e.g. in hardware or through software or a combination of both) to control the measurement divisor (i.e. the divisor value "N" used in method 904), as well as the measurement time (i.e. the time used in method 906). The frequency measurement may be performed (e.g. by hardware or through software or a combination of both) in multiple ways, and return a result for whichever measurement completes first. This is illustrated in the timing diagrams 1100 in FIG. 11, for a high frequency signal 1102 and medium frequency signal 1104. In both cases the divisor is "6", and consequently the count value obtained with the divisor (through method 904) is returned for the high frequency signal case 1102, while the count value obtained with the measurement time (through method 906) is returned for the medium frequency signal case 1104. Diagram 1200 provides an illustration of an example input frequency signal (represented by the curve) which changes from high, to medium, to low frequencies over time. Table 1202 provides an indication of the counter characteristics for each signal frequency group. For high signal frequency (i.e. high frequency inputs), divisor periods of the signal may be measured. For medium signal frequency (i.e. medium frequency inputs), as many periods as possible may be measured within the measurement time (that is, between 1 and the divisor). For low signal frequency (i.e. low frequency inputs), a period of the signal may be measured.

Figures 10, 11:
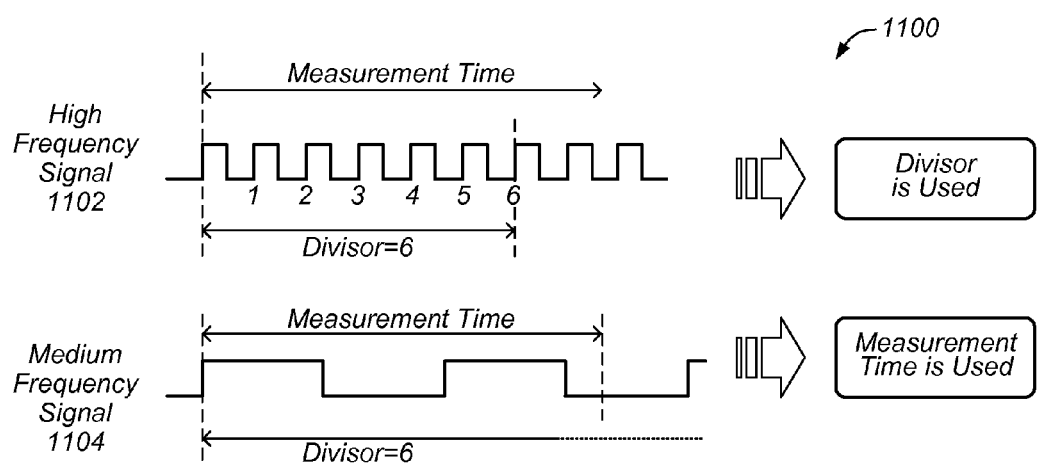
FIG. 10 shows a table illustrating the tradeoffs when balancing measurement time versus delay, according to prior art.
FIG. 11 shows timing diagrams illustrating operation of a counter performing dynamic frequency measurements, according to one embodiment.

As shown in FIGS. 11 and 12, for high frequency inputs, the counter may measure the specified "Divisor" number of periods of the input signal prior to the "Measurement Time" elapsing. In this case, the frequency measurement may be completed using these "Divisor" number of periods. If the input signal slows down a little bit, then the counter may not be able to complete the measurement during the "Divisor" number of periods. Therefore, the counter may instead measure as many complete periods of the input signal as possible within the specified "Measurement Time". When the input signal slows down even further, even a single period of the input signal may take longer than the specified "Measurement Time". In this case, the counter may continue to perform its measurements using a single period of the input signal. Note that further improvements in the measurement in this case may be achieved by also implementing the improved measurement delay method as described above under the section "Counter Improvements: Measurement Delay".

Further improvements may be achieved when completing a measurement based on a "measurement time". Referring again to the "High Frequency with 2 Counters" method 906 in FIG. 9, 10,000 edges of the Input signal are counted during the 1 ms Timer interval. However, the actual time period associated with those 10,000 edges (i.e. the actual time period spanning the 10,000 edges) may not be exactly 1 ms. Therefore, a more accurate measurement may be achieved within the same 1 ms "measurement time" by separately counting the actual time elapsed during the 10,000 edges of the Input signal, as opposed to assuming that the measured input signal periods completely fill the 1 ms "measurement time". This count may be performed based on a high-frequency reference, for example a 100 MHz timer in the example provided for method 906. Therefore, not only are various embodiments of improved (dynamic frequency) counters disclosed herein functionally backward compatible with existing "High Frequency with 2 Counters" measurement methods, they may actually achieve better performance through an additional counter that measures the exact amount of time elapsed for the number of input periods that were measured during the specified measurement time.

The following summarizes the differences between traditional counters and embodiments of improved counters disclosed herein. A traditional Low-Frequency counter returns a number representing time, measured during a single period of the input signal. A traditional High-Frequency counter returns a number representing the number of signal periods of the input signal measured during a specified measurement time (ex: 1 ms), and the measurement time is assumed to be equal to the specified measurement time. A traditional Large-Range counter returns a number representing time over a specified number of signal periods of the input signal, where the number of signal periods is assumed to be equal to a specified divisor.

In all modes, an improved counter may return two numbers: a first number indicating the elapsed time (as measured by a high-frequency time base or time reference, e.g. a 100 MHz time base/time reference), and a second number indicating the number of signal periods of the input signal that have been measured. Accordingly, the improved counters may be considered to provide a performance commensurate with the performance of traditional counters in case of Low-Frequency mode and Large-Range mode counters. However, improved counters operating in High-Frequency Mode show marked improvement over traditional counters operating in that mode, as they make available the actual time duration associated with measured signal periods, instead of relying on the assumption that the actual measurement time period is equal to the specified measurement time. Dynamic Frequency mode counters provide additional benefits as described herein, and as is further outlined below.

Improved Counters

Improved counters may thereby be obtained according to the various embodiments described above. In one set of embodiments, counter hardware implementing dynamic frequency measurement as described above may be designed to be backwards compatible with traditional frequency measurement methods. Table 1300 in FIG. 13 shows how the hardware may be configured to be backwards compatible with all three methods (902, 904, 906), while also capable of performing dynamic frequency measurement. Again, the "divisor" represents the number "N" shown in FIG. 9 with reference to method 904, and the measurement time (<Meas. Time>) represents the measurement time shown in FIG. 9 with reference to method 906. For the new "dynamic frequency measurement" mode, both the "measurement time" and "measurement divisor" settings may be enabled. However, by disabling either the "measurement time" or the "measurement divisor", the counter is made backwards compatible with traditional frequency measurement methods.

In addition, usability improvements over traditional counter measurement methods include the provision of a user-interface where the following inputs may be provided/entered as desired:

the desired type of measurement (e.g.: frequency measurement, time measurement, etc.)

the minimum and maximum expected values for the signal to be measured.

the desired sample clock rate (i.e.: how often is a read of the counter measurement desired).

The sample clock rate may be used as a first order estimate for how much measurement latency may be tolerated. Specifically, a slow sample clock implies a larger divisor and longer measurement time, which achieves better accuracy but requires longer measurement times. A fast sample clock implies a smaller divisor and shorter measurement time, which achieves lower measurement times and lower latency at the expense of accuracy (i.e. it results in decreased accuracy). This information may then be used to configure the "dynamic frequency measurement" mode with sensible default values for "measurement time" and "measurement divisor" without a need to understand the differences or tradeoffs associated with the traditional counter measurement modes. This results in improved ease-of-use, full control for advanced use in fine tuning applications by directly controlling the "measurement time" and "measurement divisor", and backward compatibility with traditional counter frequency measurement methods.

Figure 14:
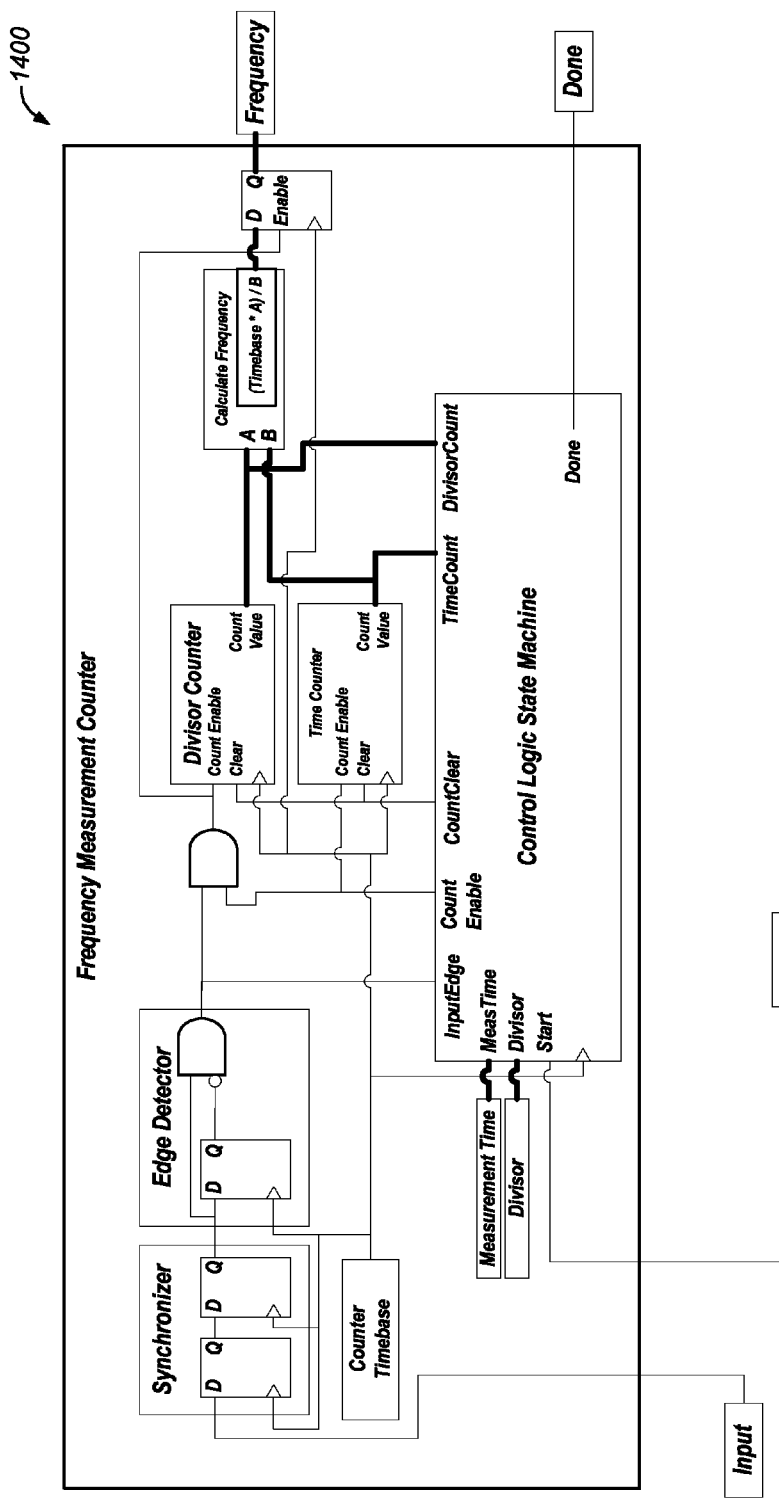
FIG. 14 shows a partial logic diagram of one embodiment of an improved counter capable of performing dynamic (frequency) measurements.

FIG. 14 shows a simplified logic diagram of one embodiment of a counter 1400 capable of performing dynamic measurements, more specifically (for the example shown) dynamic frequency measurement. Counter 1400 is shown with enough detail to illustrate the basic concept of the "Dynamic Frequency Measurement" mode/method described herein. Various embodiments and implementations may include additional components or modified components as desired and/or required, while still operating according to the principles described above and throughout. It should be noted that for the purposes of simplicity, counter 1400 shown performs a single frequency measurement whenever "Start" is asserted, and asserts a "Done" pulse whenever the measurement is complete. In other embodiments, the counter may continuously monitor the input signal and produce updated frequency measurement periodically as the input signal continues toggling. This may be implemented through additional circuitry (not shown) included to dynamically reload the counters with a different starting value. Counter 1400 may further include logic to detect and track decelerating inputs (per counter 1600 shown in FIG. 16), and/or additional logic to "Timeout" if the input signal becomes too slow. The count values are shown as thick wires representing a multi-bit number. The counter itself may have any number of bits (24, 32, 64-bit, etc.)

Figure 15:
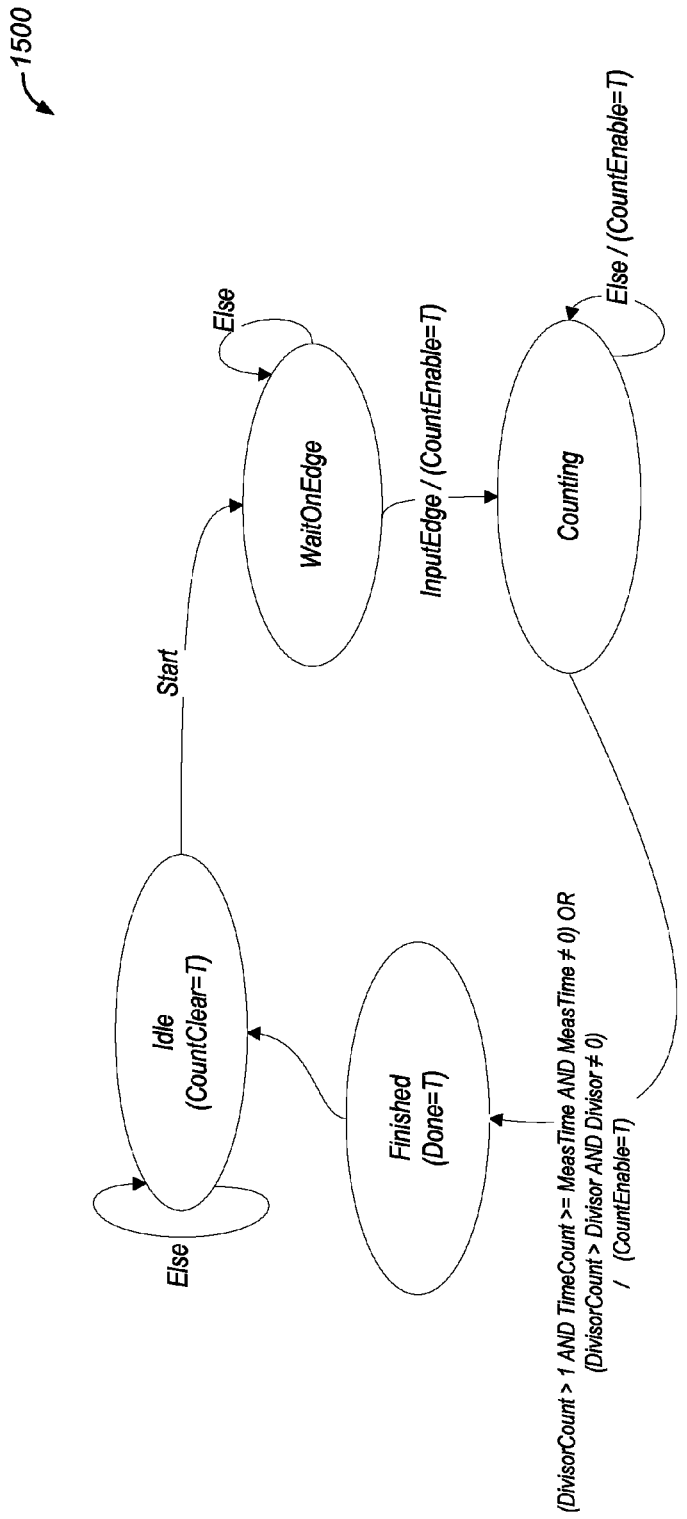
FIG. 15 shows a state diagram illustrating operation of the improved counter of FIG. 14, according to one embodiment.

Counter 1400, as shown, performs frequency measurement off of rising edges. In other embodiments, the counter may include additional configuration options (rising/falling edge selection, as well as ability to perform other measurements such as pulse-width, duty-cycle, period, edge separation, etc.) measurements, not just frequency measurements. In addition, while counter 1400 is shown measuring a single signal, additional logic may be added in front of counter 1400 to support velocity measurements on incremental or absolute encoders. For the sake of simplicity, the logic for sampling or returning the frequency measurement has also been omitted in FIG. 14, and the timestamping/interpolating feature may also be added (those features illustrated, for example, in FIG. 17). The Divisor Counter and Time Counter shown in FIG. 14 are basic counters, whereby they may reset to 0 (zero) on a rising-edge of the clock (received from the Counter Timebase) if Clear is asserted. Furthermore, they may increment on a rising-edge of clock if Enable is asserted, otherwise, they may hold their current value. Logic may also be added to address counter rollover. FIG. 15 shows a basic state diagram illustrating operation of counter 1400 according to one embodiment.

The benefits of counter flexibility as pertaining to embodiments of the improved counters described herein may be further detailed as follows. Referring to measurement counter 1400, for example, at high input frequencies (e.g.: 10 MHz), the divisor may be set to 100. Accordingly, the input signal gets divided down by 100, which makes it possible to achieve (a specified) target measurement accuracy. The measurement time required to measure 100 periods of a 10 MHz signal is 100 periods*100 ns=10 us. However, if the input signal slows down at some point during the measurement process, it may take too long to measure 100 periods. Therefore, an independent time limit may also be specified, during which the measurement is expected to complete. For example, a maximum time limit of 1 ms may be specified for the measurement to complete. In other words, the measurement may be considered complete 1 ms after start of the measurement, regardless of whether 100 periods have been measured. This means that at 100 kHz (10 us) the full 100 periods may be measured, but for anything slower than 100 kHz, instead of measuring 100 periods, the number of periods that fit within 1 ms may be measured.

Therefore, counter 1400 (for example) may be configured to make application specific measurement accuracy vs. latency tradeoffs by changing the measurement time (value) and divisor. In general, the "divisor" (value) may be used to complete measurements for input signals at high frequencies, and the "measurement time" (value) may be used to complete measurements at lower input frequencies.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A counter comprising:
a first input configured to receive a divisor value associated with a first method of operation;
a second input configured to receive a measurement time value associated with a second method of operation; and
counter circuitry configured to:
perform a first measurement on an input signal according to the first method of operation using at least the divisor value; and
perform a second measurement on the input signal according to the second method of operation using at least the measurement time value, wherein performance of the first measurement at least partially overlaps with performance of the second measurement; and
provide a measurement value obtained from whichever respective measurement of the first measurement and the second measurement completes first.

2. The counter of claim 1, wherein the counter circuitry is further configured to:
for each present input period of the input signal:
if the present input period of the input signal is longer than a most recent previous input period of the input signal, continuously monitor the input signal for at least a first time period of specified length until an end of the present input period.

3. The counter of claim 2, wherein the counter circuitry is further configured to:
begin continuously monitoring the input signal during the present input period of the input signal from a point in time at which the present input period of the input signal has reached a duration commensurate with a duration of the most recent previous input period of the input signal.

4. The counter of claim 1, wherein the counter circuitry is further configured to measure an actual time required for input periods of the input signal to occur within a specified measurement time that corresponds to the measurement time value.

5. The counter of claim 1, wherein the counter circuitry is further configured to:
when performing multiple first measurements and second measurements:
obtain a respective timestamp information with each measurement value; and
use the respective timestamp information to obtain interpolated values in-between measurement values.

6. The counter of claim 5, wherein the timestamp information is indicative of a point in time to which the measurement value corresponds.

7. The counter of claim 1, further comprising one or more of:
a third input configured to receive measurement type value indicative of a desired type of measurement;
a fourth input configured to receive minimum and maximum expected values for a signal to be measured; or
a fifth input configured to receive measurement sample clock timing information.

8. A method for performing measurements on an input signal, the method comprising:
receiving, at a counting device, a divisor value associated with a first type of operation;
receiving, at the counting device, a measurement time value associated with a second type of operation;
performing, by the counting device:
a first measurement on the input signal according to the first type of operation using the divisor value; and
a second measurement on the input signal according to the second type of operation using the measurement time value, wherein said performing the first measurement at least partially overlaps said performing the second measurement; and
providing a measurement value obtained from whichever respective measurement of the first measurement and the second measurement completes first.

9. The method of claim 8, further comprising:
for each present input period of the input signal:

continuously monitoring the input signal for at least a first time period of specified length until an end of the present input period of the input signal if the present input period of the input signal is longer than a most recent previous input period of the input signal.

10. The method of claim 9, wherein said continuously monitoring the input signal comprises:
beginning to continuously monitor the input signal during the present input period of the input signal from a point in time at which the present input period of the input signal has reached a duration commensurate with a duration of the most recent previous input period of the input signal.

11. The method of claim 8, further comprising measuring an actual time required for input periods of the input signal to occur within a specified measurement time that corresponds to the measurement time value.

12. The method of claim 11 further comprising:
when performing multiple first measurements and second measurements:
obtaining a respective timestamp information with each measurement value; and
interpolating values in-between measurement values according to at least the respective timestamp information.

13. The method of claim 12, wherein the timestamp information is indicative of a point in time to which the count value corresponds.

14. The method of claim 8, further comprising at least one of:
receiving, at the counting device, a measurement type value indicative of a desired type of measurement;
receiving, at the counting device, minimum and maximum expected values for a signal to be measured;
receiving, at the counting device, sample clock timing information representing a rate at which the measurements are to be sampled; and
wherein said performing the first measurement and the second measurement comprises performing the first measurement and the second measurement according to at least:
the received measurement type when receiving the measurement type;
the received minimum and maximum expected values when receiving the minimum and maximum expected values; or
the received sample clock timing information when receiving the sample clock information.

15. A measurement system comprising:
a first device configured to perform a specified function;
a monitoring device configured to provide a feedback signal from the first device, wherein the feedback signal is indicative of an operating characteristic of the first device; and
a counter configured to:
receive a divisor value associated with a first method of operation;
receive a measurement time value associated with a second method of operation;
perform a first measurement on the feedback signal according to the first method of operation using the divisor value;
perform a second measurement on the input signal according to the second method of operation using the measurement time value, wherein performance of the first measurement at least partially overlaps with performance of the second measurement; and
provide a measurement value obtained from whichever respective measurement of the first measurement and the second measurement completes first.

16. The measurement system of claim 15, wherein the counter is further configured to:
for each present input period of the feedback signal:
if the present input period of the feedback signal is longer than a most recent previous input period of the feedback signal, continuously monitor the feedback signal for at least a first time period of specified length until an end of the present input period of the feedback signal.

17. The measurement system of claim 16, wherein the counter is further configured to:
begin continuously monitoring the feedback signal during the present input period of the feedback signal from a point in time at which the present input period of the feedback signal has reached a duration commensurate with a duration of the most recent previous input period of the feedback signal.

18. The measurement system of claim 15, wherein the counter is further configured to measure an actual time required for input periods of the feedback signal to occur within a specified measurement time that corresponds to the measurement time value.

19. The measurement system of claim 15, wherein the counter is further configured to:
when performing multiple first measurements and second measurements:
obtain a respective timestamp information with each measurement value, wherein the timestamp information is indicative of a point in time to which the measurement value corresponds; and
interpolate values in-between measurement values according to the respective timestamp information.

20. The measurement system of claim 15, wherein the counter is further configured to:
receive measurement type value indicative of a desired type of measurement;
receive minimum and maximum expected values for a signal to be measured;
receive sample clock timing information representing a rate at which the measurements are to be sampled; and
perform the first measurement and the second measurement according to the received measurement type value, the received minimum and maximum expected values, and the received sample clock timing value.

* * * * *